United States Patent [19]
Gurary et al.

[11] Patent Number: 5,840,124
[45] Date of Patent: Nov. 24, 1998

[54] WAFER CARRIER WITH FLEXIBLE WAFER FLAT HOLDER

[75] Inventors: Alexander I. Gurary, Bridgewater; Scott Beherrell, Phillipsburg; Vadim Boguslavskiy, Somerville, all of N.J.

[73] Assignee: Emcore Corporation, Somerset, N.J.

[21] Appl. No.: 884,743

[22] Filed: Jun. 30, 1997

[51] Int. Cl.$^6$ ............................................. C23C 16/00
[52] U.S. Cl. ............................................. 118/726
[58] Field of Search ................................. 118/728

[56] References Cited

U.S. PATENT DOCUMENTS

| | | |
|---|---|---|
| 4,182,265 | 1/1980 | Bracher . |
| 4,971,676 | 11/1990 | Doue et al. . |
| 5,207,324 | 5/1993 | Kos . |
| 5,391,231 | 2/1995 | Schertler ................... 118/728 |
| 5,494,524 | 2/1996 | Inaba et al. . |
| 5,683,518 | 11/1997 | Moore ..................... 118/728 |

*Primary Examiner*—Richard Bueker
*Attorney, Agent, or Firm*—Lerner, David, Littenberg, Krumholz & Mentlik

[57] ABSTRACT

Apparatus for mounting wafers in an epitaxial reactor is disclosed. The apparatus includes a wafer carrier for holding the wafer during the epitaxial deposition, including a depressed region for the wafer, and a positioning wire located in the depressed region to maintain the position of the wafer without interfering with the epitaxial deposition process itself.

63 Claims, 1 Drawing Sheet

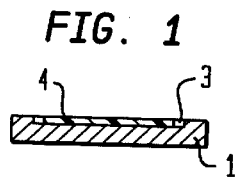
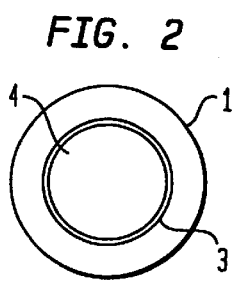
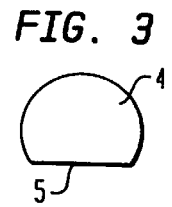
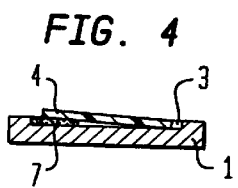
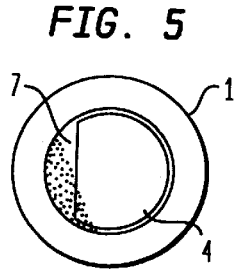
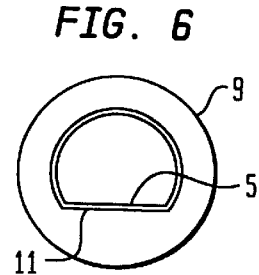
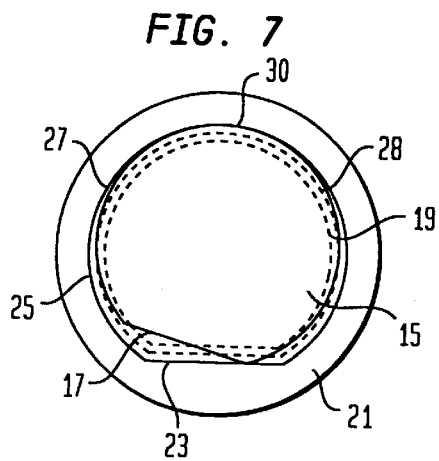
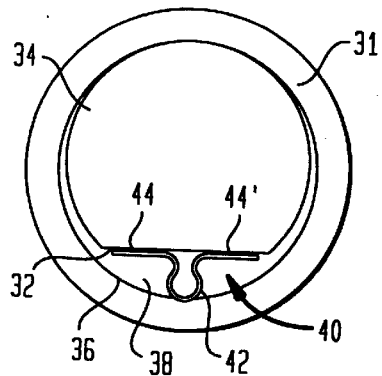
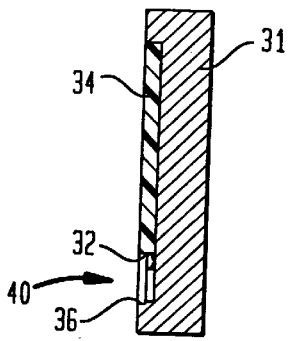

WAFER CARRIER WITH FLEXIBLE WAFER FLAT HOLDER

FIELD OF THE INVENTION

The present invention relates to epitaxial deposition onto semiconductor wafers. More particularly, the present invention relates to wafer carriers for carrying wafers during such epitaxial deposition processes. Still more particularly, the present invention relates to the maintenance of wafers on wafer carriers utilized in connection with the epitaxial deposition onto such wafers.

BACKGROUND OF THE INVENTION

In connection with the deposition of epitaxial layers onto semiconductor wafers, it is quite conventional to mount the wafers within a reactor in a generally horizontal position, and on a support such as a susceptor which is often made of graphite and like materials. In many of these reactors, the uniformity in the growth of these epitaxial layers is attained by the use of a rapidly rotating susceptor on which the wafer or wafers are mounted. Therefore, there has been a need to maintain the wafers on the susceptor and in a desired position against the forces created by such rotation. One particular method for doing so is to locate these wafers within cavities or wafer pockets which are formed on top of the susceptor, such as in a wafer carrier or the like. Such a wafer carrier which has been utilized in the past, including a wafer pocket for maintaining the wafer in position during the epitaxy process itself, is shown in FIGS. 1 and 2 hereof. Thus, the wafer carrier 1, which can be part of the susceptor itself or which can be mounted on a susceptor for rotation therewith, includes an interior pocket 3 so that the wafer 4 can be maintained thereon. As shown in FIGS. 1 and 2, the wafers are generally circular in configuration, as is the pocket 3 in which the wafer is then mounted.

The use of a specific wafer carrier such as that shown in FIGS. 1 and 2 has been found to be quite useful not only during the epitaxial process, but in order to transfer the wafer from a loadlock mechanism to the reactor itself or between reactors without exposing the internal portions of the reactor to the atmosphere, thus creating the possibility of contamination which can result therefrom.

In order to define the crystal structure orientation of such wafers, it has now become common to include a flat portion 5 on one surface of the wafer 4, as shown in FIG. 3 hereof. However, with the development of such wafers, it can be readily seen that the placement of such a wafer as shown in FIG. 3 into the conventional wafer carrier 1 as shown in FIGS. 1 and 2 can lead to difficulties. That is, as can be specifically seen in FIGS. 4 and 5 hereof, after placement of a wafer including a flat portion 5 into a round or circular pocket 3 within the wafer carrier 1, the epitaxial material will be deposited not only on the surface of the wafer but on the bottom of the pocket 3 itself. Thus, as is shown in FIGS. 4 and 5, some of this epitaxial material has been deposited on the surface 7 of the pocket 3. Thus, upon continued subsequent use of such wafer carriers 1, the subsequent wafer will in most likelihood not be placed in the exact same location as the prior wafer, and, therefore, at least a portion of the bottom surface of the wafer 4 will overlay the portion of the bottom surface 7 of the pocket 3 which has previously had epitaxial material deposited thereon. With continued use, it is, therefore, inevitable that this will result in non-uniform heating of the wafer and thus non-uniform deposition of epitaxial material thereonto. These results cannot be tolerated to any significant extent.

In order to overcome this problem, wafer carriers have been devised such as the wafer carrier 9 shown in FIG. 6. Thus, in this case, the wafer carrier 9 includes a shape which corresponds to the shape of the wafer 4 shown in FIG. 3. The wafer carrier thus includes a similar flat area 11 corresponding to the flat area 5 on the wafer itself.

New problems, however, have now arisen, particularly in connection with the increasing use of oxidizing environments for epitaxial deposition in which oxidation takes place. These environments are rather high-temperature environments, generally including temperatures of greater than about 600° C. to 800° C. Conventional wafer carriers have been produced from materials such as graphite and molybdenum. These materials are generally satisfactory when used in the non-oxidizing lower-temperature environments previously encountered. However, these materials cannot be used in these oxidizing environments, at temperatures of 400° C and higher, because they cannot withstand the physical constraints placed upon them in such environments.

There have been additional efforts to mount semiconductor wafers in connection with epitaxial reactions in the past. For example, Doue et al., U.S. Pat. No. 4,971,676, discloses a support for such wafer substrates which is said to allow for reliable, rapid and efficient setting of the wafer in position while at the same time immobilizing the substrate. In this case, the patentee discloses such a device which includes a platen 2 as shown in FIGS. 1 and 2 thereof, with a central opening surrounded by three fixed abutments 9 and a stud 14 for maintaining the wafer in place. The stud 14 is permanently subjected to a spring action by means of a hairpin spring 20 bearing against the stem access 16 of the stud. The wafer can thus be loaded by recessing the stud below the surface of the platen, and then raising it to bear against the side of the wafer to hold it in place.

The maintenance of such wafers in position is also extremely important for maintaining uniform heating. Thus, in Inaba et al., U.S. Pat. No. 5,494,524, an improved stack of wafer holders is disclosed in which the wafers are mounted on a semicircular array as shown in FIG. 7 thereof, but in which each of the wafer holders has a hollow interior such as shown in FIG. 2 thereof, so that heated air can be circulated through that passage to uniformly heat all of the surface of the wafer at one time. Additionally, Bracher, U.S. Pat. No. 4,182,265, discloses yet another wafer support, in this case for use in connection with vacuum vaporization apparatus. In this case, the wafer is held in place by a number of retaining rods 7 which cover a portion of the wafer surface on holding it in place on the platform or shoulder 4 shown in the Figures of that patent.

SUMMARY OF THE INVENTION

In accordance with the present invention, these and other objects have now been realized by the invention of apparatus for mounting wafers having an upper surface during epitaxial deposition onto the upper surface of the wafers in a reactor, the apparatus comprising a wafer carrier for holding the wafer during the epitaxial deposition, the wafer carrier including a depressed region for accommodating the wafer and maintaining the wafer on the wafer carrier during the epitaxial deposition, and a positioning member located in the depressed region for maintaining the position of the wafer within the depressed region during the epitaxial deposition without interfering with the epitaxial deposition onto the upper surface thereof.

In accordance with one embodiment of the apparatus of the present invention, the depressed region comprises an inner wall portion, and the positioning member is disposed between the inner wall portion and the wafer.

In accordance with one embodiment of the apparatus of the present invention, the wafer carrier is permanently mounted in the reactor. In another embodiment, however, the wafer carrier is removable from the reactor.

In accordance with another embodiment of the apparatus of the present invention, the positioning member comprises a deformable member whereby the deformable member can maintain the position of the wafer within the depressed region during variations in temperature within the reactor by deforming to accommodate differences in the linear expansion of the wafer carrier and the wafer. In a preferred embodiment, the deformable member comprises a flexible wire, and most preferably including a central head portion and a pair of extending wing portions for contacting the wafer.

In accordance with another embodiment of the apparatus of the present invention, the wafer carrier has a first coefficient of linear expansion and the wafer has a second coefficient of linear expansion, and the first coefficient of linear expansion is substantially greater than the second coefficient of linear expansion. Preferably, the differences between the first and second coefficients of linear expansion are greater than about 50%. In a preferred embodiment, the wafer carrier comprises a superalloy, preferably a superalloy of a metal selected from the group consisting of nickel- or iron-based superalloys, or a ceramic-based material, such as alumina or zirconia.

In accordance with one embodiment of the apparatus of the present invention, the wafer comprises a substantially circular wafer including a flat area on one side of the circular configuration whereby the positioning member is located between the inner wall portion of the depressed region and the flat area of the wafer.

In accordance with another embodiment of the apparatus of the present invention, the reactor is adapted to carry out the epitaxial deposition in an oxygen-containing environment. In accordance with another embodiment of the apparatus of the present invention, the wafer has a substantially circular configuration with a diameter of at least about 3 inches.

In accordance with another embodiment of the apparatus of the present invention, the reactor is adapted to carry out the epitaxial deposition on a single one of the wafers.

In accordance with another embodiment of the apparatus of the present invention, the reactor includes rotation means for rotating the wafer carrier within the reactor during the epitaxial deposition onto the wafer.

In accordance with another embodiment of the present invention, the positioning member comprises a superalloy or a ceramic material. Preferably, the superalloy or ceramic material is in the form of a flexible wire. Most preferably, the flexible wire includes a central head portion and a pair of extending arm portions for contacting the wafer.

BRIEF DESCRIPTION OF THE DRAWINGS

The present invention may be more fully appreciated with reference to the following detailed description, which, in turn, refers to the Figures in which:

FIG. 1 is a side, elevational, cross-sectional view of a wafer carrier according to the prior art;

FIG. 2 is a top, elevational view of the wafer carrier shown in FIG. 1;

FIG. 3 is a top, elevational view of a wafer in accordance with the prior art;

FIG. 4 is a side, elevational, sectional view of a wafer carrier in accordance with the prior art including the wafer shown in FIG. 3;

FIG. 5 is a top, elevational view of the wafer carrier and wafer shown in FIG. 4;

FIG. 6 is a top, elevational view of a wafer carrier and a wafer in accordance with the prior art;

FIG. 7 is a top, elevational view of the wafer carrier and wafer shown in FIG. 6 under increased temperature conditions;

FIG. 8 is a top, elevational view of the wafer carrier containing a wafer in accordance with the present invention; and FIG. 9 is a side, elevational, sectional view of the wafer carrier shown in FIG. 8.

DETAILED DESCRIPTION

When conventional wafer carriers comprising materials such as graphite and molybdenum are employed in oxidizing environments, including temperatures of above about 400° C., and generally greater than about 600° C. to 800° C., serious problems are encountered with respect to the physical properties of these carriers. As used throughout this specification, the term wafer carrier itself can apply to a separate removable wafer carrier in which one or more wafers is placed and which itself can thus be inserted into and removed from the reactor along with the wafer. The term wafer carrier, however, can also refer to the upper surface of a rotating susceptor, or other mounting device which is a permanent part of a reactor of this type, and which includes a depressed region or pocket within the surface which thus acts as the wafer carrier hereof. In this case, the wafers themselves will be transferred in and out of the reactor for placement into these wafer carriers or pockets for reaction therein.

In any event, a solution to the problems encountered with respect to the physical properties of conventional wafer carriers is to employ a material which can withstand such high-temperature oxidizing atmospheres. The materials which would be useful in this regard include superalloys and certain ceramic materials. These materials, however, have a significantly higher coefficient of linear expansion than either the conventional carrier materials previously utilized (such as graphite, with a coefficient of about 3.0 to 8.0, and molybdenum, having a coefficient of about 4.9) or than the coefficient of linear expansion of the materials which are used for the wafers themselves (for example, silica, with a coefficient of linear expansion of about 2.6; gallium arsenide, with a coefficient of linear expansion of about 6.0; and indium phosphite, with a coefficient of linear expansion of about 4.5). In general, these superalloy and ceramic-based materials have a coefficient of linear expansion which is at least 50% greater than that of the wafer materials themselves. Thus, typical superalloy materials, such as superalloys of metals, such as iron, nickel and the like, have coefficients of linear expansion generally about three times greater than those discussed above, or even greater. These include, for example, materials such as Kanthal, with a coefficient of linear expansion of about 15.0; Haynes, with a coefficient of linear expansion of about 18.6; and Inconell, having a coefficient of linear expansion of about 16.4. Furthermore, typical ceramic materials, such as alumina, zirconia and the like, have a coefficient of linear expansion which ranges from one and one-half to four times higher than the coefficient of linear expansion of the wafer materials, or even greater.

While the use of these materials thus overcomes the problems which are encountered with the materials previously employed, a new problem is created in that when operating at these higher temperatures, a gap will develop between the internal wall of the depressed region of the wafer carrier and the wafer itself. As can be seen, for example, from FIG. 7, the wafer 15 having a flat face 7 has a normal outer dimension 19 at room temperature, which is shown by the interrupted line therein. The wafer carrier 21, including the flat face 23 and a depressed region 25 defined by inner wall 27, has an inner wall configuration with an inner diameter 28 at room temperature as shown by the interrupted line therein. At the elevated temperatures encountered in the oxidizing environments discussed herein, however, in view of the elevated coefficients of thermal expansion for these superalloy and ceramic materials, the inner diameter of the inner wall 27 has now expanded to the point as shown at 30 in solid line therein. Therefore, the distance between the wafer 15 and the wafer carrier 21 has considerably increased at these conditions, and as shown in FIG. 7, the wafer itself can now rotate by a small angle so that the flat surface 17 of the wafer 15 is no longer parallel to the flat surface 23 of the wafer carrier 21. This, in turn, creates the very same problems in terms of potential deposition of epitaxial material onto the bottom wall of the depressed region 25 of the wafer carrier 21, which can now intervene at various locations between the wafer carrier surface and the wafer itself during subsequent usage, therefore potentially affecting the uniformity of heating of the wafer itself and of the epitaxial deposition resulting thereon. Furthermore, such rotation of the wafer 15 within the enlarged depressed region 25 can result in serious damage to the wafer itself upon cooling; i.e., as the wafer carrier 21 is reduced to its original size, but now with the flat surface 17 of the wafer 15 at an angle to the flat face 23 of the wafer carrier 21.

To overcome these problems, in accordance with this invention, as shown in FIGS. 8 and 9, the wafer carrier 31 can now have the circular inner and outer configuration of prior wafer carriers such as those shown in FIGS. 1 and 2 hereof. This, of course, leaves a space between the flat surface 32 of the wafer 34 and the inner wall 36 of the depressed region 38 of the wafer carrier 31. Interposed within this space, however, is positioning member 40. It is, therefore, now possible to provide highly repeatable and stress-free wafer location in consecutive usage of a wafer carrier within the depressed region of the wafer carrier even when materials having extremely high coefficients of linear expansion such as superalloys are employed.

In order to attempt to quantify the differences in distance between the inner wall of the wafer carrier 31 and the flat surface 32 of the wafer 34, it can be seen that deformation of the wafer carrier 31 vis-a-vis the wafer 34, so that the deformation of the positioning member 40 during cooling cycles must exceed L as follows:

$L = (C_{carrier} - C_{wafer}) \times T_{wafer} \times D_{wafer}$, wherein $C_{carrier}$=the coefficient of linear expansion of the wafer carrier material;

$C_{wafer}$=the coefficient of linear expansion of the wafer material;

$T_{wafer}$=the wafer temperature; and $D_{wafer}$=the wafer diameter.

In other words, it is only necessary that the positioning member deform sufficiently to accommodate the difference between the shrinkage of the wafer and that of the wafer carrier itself during the cooling cycle. At maximum temperatures, the positioning member is adapted so that no deformation is necessary; i.e., it merely interposes itself between the inner wall 36 of the wafer carrier 31 and the flat surface 32 of the wafer 34, since very little pressure is required to maintain the position of the wafer. As is discussed above, movement of the wafer is a problem based on vibration and the like caused by rotation of the wafer carrier within the reactor, at least in those cases where a rotating wafer carrier is utilized. Furthermore, movement of the wafer can also be caused by the flow of reactants over the surface of the wafer, and by vibration caused by the use of pumps and other such equipment. The deformation of the positioning member thus need not exceed the value defined by the above equation, and such deformation during the cooling cycle need only provide a small load which is not harmful to the wafer itself.

As for the positioning member itself, this member is preferably a flexible element, such as a wire which is preferably of a shape such as that shown in FIGS. 8 and 9. Thus, the preferred embodiment shown in these drawings includes a head portion 42 and wing portions 44 and 44', which bear against the flat surface 32 of the wafer 34. In a preferred embodiment, this flexible element can itself be made of the same materials discussed above with respect to the wafer carriers of the present invention, such as a superalloy or a ceramic-based wire, and can have a variety of different shapes and types. In general, however, it is required that the positioning member itself be made of a material which is compatible with the process environment including the temperatures which are to be encountered in the reactors for epitaxial deposition in accordance with this invention. Thus, once again, at these conditions including the aforementioned temperature conditions, the positioning member must not only be compatible with this environment, but must be able to deform to accommodate the values defined by the equation set forth hereinabove.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

We claim:

1. Apparatus for mounting wafers having an upper surface during epitaxial deposition onto said upper surface of said wafers in a reactor, said apparatus comprising a wafer carrier for holding said wafer during said epitaxial deposition, said wafer carrier including a depressed region for accommodating said wafer and maintaining said wafer on said wafer carrier during said epitaxial deposition, and a positioning member located in said depressed region for maintaining the position of said wafer within said depressed region during said epitaxial deposition without interfering with said epitaxial deposition onto said upper surface thereof, said positioning member comprising a flexible wire including a central head portion and a pair of extending wing portions for contacting said wafer, whereby said flexible wire can maintain said position of said wafer within said depressed region during variations in temperature within said reactor by deforming to accommodate differences in the linear expansion of said wafer carrier and said wafer.

2. The apparatus of claim 1 wherein said depressed region comprises an inner wall portion, and wherein said positioning means is disposed between said inner wall portion and said wafer.

3. The apparatus of claim 1 wherein said wafer carrier is permanently mounted in said reactor.

4. The apparatus of claim 1 wherein said wafer carrier is removable from said reactor.

5. The apparatus of claim 1 wherein said wafer carrier has a first coefficient of linear expansion and said wafer has a second coefficient of linear expansion and wherein said first coefficient of linear expansion is substantially greater than said second coefficient of linear expansion.

6. The apparatus of claim 5 wherein the differences between said first and second coefficients of linear expansion are greater than about 50%.

7. The apparatus of claim 5 wherein said wafer carrier comprises a superalloy.

8. The apparatus of claim 7 wherein said superalloy comprises a superalloy of a metal selected from the group consisting of nickel and iron.

9. The apparatus of claim 6 wherein said wafer carrier comprises a ceramic material.

10. The apparatus of claim 2 wherein said wafer comprises a substantially circular wafer including a flat area on one side of said circular configuration whereby said positioning member is located between said inner wall portion of said depressed region and said flat area of said wafer.

11. The apparatus of claim 1 wherein said reactor is adapted to carry out said epitaxial deposition in an oxygen-containing environment.

12. The apparatus of claim 11 wherein said wafer comprises a substantially circular wafer including a flat area on one side of said circular configuration, and said depressed region comprises an inner wall portion, said positioning member being disposed between said inner wall portion of said depressed region and said flat area of said wafer.

13. The apparatus of claim 1 wherein said wafer carrier comprises a superalloy.

14. The apparatus of claim 13 wherein said superalloy comprises an alloy of a metal selected from the group consisting of nickel and iron.

15. The apparatus of claim 12 wherein said wafer carrier comprises a ceramic material.

16. The apparatus of claim 1 wherein said wafer has a substantially circular configuration with a diameter of at least about 3 inches.

17. The apparatus of claim 1 wherein said reactor is adapted to carry out said epitaxial deposition on a single one of said wafers.

18. The apparatus of claim 1 including rotation means for rotating said wafer carrier within said reactor during said epitaxial deposition onto said wafer.

19. The apparatus of claim 1 wherein said positioning member comprises a superalloy.

20. The apparatus of claim 1 wherein said positioning member comprises a ceramic material.

21. The apparatus of claim 1 wherein said positioning member is in the form of a flexible wire.

22. The apparatus, of claim 21 wherein said flexible wire includes a central head portion and a pair of extending wing portions for contacting said wafer.

23. Apparatus for mounting wafer having an upper surface in a reactor, said apparatus comprising a wafer carrier for holding said wafer, said wafer carrier including a depressed region for accommodating said wafer and maintaining said wafer on said wafer carrier, said wafer carrier having a first coefficient of linear expansion and said wafer having a second coefficient of linear expansion, wherein said first coefficient of linear expansion is substantially greater than said second coefficient of linear expansion and the differences between said first and second coefficients of linear expansion are greater than about 50%, said wafer carrier comprising a superalloy, and a positioning member located in said depressed region for maintaining the position of said wafer within said depressed region without interfering with the upper surface of said wafer.

24. The apparatus of claim 23 wherein said depressed region comprises an inner wall portion, and wherein said positioning means is disposed between said inner wall portion and said wafer.

25. The apparatus of claim 23 wherein said positioning member comprises a deformable member whereby said deformable member can maintain said position of said wafer within said depressed region during variations in temperatures within said reactor by deforming to accommodate differences in the linear expansion of said wafer carrier and said wafer.

26. The apparatus of claim 25 wherein said deformable member comprises a flexible wire.

27. The apparatus of claim 26 wherein said flexible wire includes a central head portion and a pair of extending wing portions for contacting said wafer.

28. The apparatus of claim 23 wherein said superalloy comprises a superalloy of a metal selected from the group consisting of nickel and iron.

29. The apparatus of claim 23 wherein said wafer carrier comprises a ceramic material.

30. Apparatus for mounting wafers having an upper surface during epitaxial deposition onto said upper surface of said wafers in a reactor adapted to carry out said epitaxial deposition in an oxygen-containing environment, said wafer comprising a substantially circular wafer including a flat area on one side of said circular configuration, said apparatus comprising a wafer carrier comprising a superalloy for holding said wafer during said epitaxial deposition, said wafer carrier including a depressed region comprising an inner wall portion for accommodating said wafer and maintaining said wafer on said wafer carrier during said epitaxial deposition, and a positioning member disposed between said inner wall portion of said depressed region and said flat area of said wafer for maintaining the. position of said wafer within said depressed region during said epitaxial deposition without interfering with said epitaxial deposition onto said upper surface thereof.

31. The apparatus of claim 30 wherein said superalloy comprises an alloy of a metal selected from the group consisting of nickel and iron.

32. The apparatus of claim 30 wherein said wafer carrier comprises a ceramic material.

33. Apparatus for mounting wafers having an upper surface during epitaxial deposition onto said upper surface of said wafers in a reactor, said apparatus comprising a wafer carrier for holding said wafer during said epitaxial deposition, said wafer carrier including a depressed region for accommodating said wafer and maintaining said wafer on said wafer carrier during said epitaxial deposition, and a positioning member comprising a superalloy located in said depressed region for maintaining the position of said wafer within said depressed region during said epitaxial deposition without interfering with said epitaxial deposition onto said upper surface thereof.

34. The apparatus of claim 33 wherein said depressed region comprises an inner wall portion, and wherein said positioning means is disposed between said inner wall portion and said wafer.

35. The apparatus of claim 33 wherein said positioning member comprises a deformable member whereby said deformable member can maintain said position of said wafer within said depressed region during variations in temperatures within said reactor by deforming to accommodate differences in the linear expansion of said wafer carrier and said wafer.

36. The apparatus of claim 35 wherein said deformable member comprises a flexible wire.

37. The apparatus of claim wherein said flexible wire includes a central head portion and a pair of extending wing portions for contacting said wafer.

38. The apparatus of claim 33 wherein said superalloy comprises a superalloy of a metal selected from the group consisting of nickel and iron.

39. The apparatus of claim 34 wherein said wafer comprises a substantially circular wafer including a flat area on one side of said circular configuration whereby said positioning member is located between said inner wall portion of said depressed region and said flat area of said wafer.

40. Apparatus for mounting wafers having an upper surface during epitaxial deposition onto said upper surface of said wafers in a reactor, said apparatus comprising a wafer carrier for holding said wafer during said epitaxial deposition, said wafer carrier including a depressed region for accommodating said wafer and maintaining said wafer on said wafer carrier during said epitaxial deposition, and a positioning member comprising flexible wire including a central head portion and a pair of extending wing portions for contacting said wafer located in said depressed region for maintaining the position of said wafer within said depressed region during said epitaxial deposition without interfering with said epitaxial deposition onto said upper surface thereof.

41. The apparatus of claim 40 wherein said depressed region comprises an inner wall portion, and wherein said positioning means is disposed between said inner wall portion and said wafer.

42. The apparatus of claim 40 wherein said wafer carrier has a first coefficient of linear expansion and said wafer has a second coefficient of linear expansion and wherein said first coefficient of linear expansion is substantially greater than said second coefficient of linear expansion.

43. The apparatus of claim wherein the difference between said first and second coefficients of linear expansion are greater than about 50%.

44. The apparatus of claim 43 wherein said wafer carrier comprises a superalloy.

45. The apparatus of claim 44 wherein said superalloy comprises a superalloy of a metal selected from the group consisting of nickel and iron.

46. The apparatus of claim 41 wherein said wafer comprises a substantially circular wafer including a flat area on one side of said circular configuration whereby said positioning member is located between said inner wall portion of said depressed region and said flat area of said wafer.

47. Apparatus for mounting wafers having an upper surface in a reactor, said apparatus comprising a wafer carrier for holding said wafer, said wafer carrier having a first coefficient of linear expansion and said wafer having a second coefficient of linear expansion, said first coefficient of linear expansion being substantially greater than said second coefficient of linear expansion, said wafer carrier including a depressed region for accommodating said wafer and maintaining said wafer on said wafer carrier, and a positioning member located in said depressed region for maintaining the position of said wafer within said depressed region, said positioning member having a third coefficient of linear expansion, said third coefficient of linear expansion being substantially greater than said second coefficient of linear expansion.

48. The apparatus of claim 47 wherein the differences between said second and third coefficients of linear expansion are greater than about 50%.

49. The apparatus of claim 48 wherein said positioning member comprises a superalloy.

50. The apparatus of claim 49 wherein said superalloy comprises a superalloy of a metal selected from the group consisting of nickel and iron.

51. The apparatus of claim 48 wherein said positioning member comprises a ceramic material.

52. The apparatus of claim 47 wherein said depressed region comprises an inner wall portion, and wherein said positioning means is disposed between said inner wall portion and said wafer.

53. The apparatus of claim 52 wherein said wafer comprises a substantially circular wafer including a flat area on one side of said circular configuration whereby said positioning member is located between said inner wall portion of said depressed region and said flat area of said wafer.

54. Apparatus for mounting wafers having an upper surface and comprising a substantially circular wafer including a flat area on one side of said circular configuration, in a reactor, said apparatus comprising a wafer carrier for holding said wafer, said wafer carrier including a depressed region comprising a substantially perpendicular inner, wall portion for accommodating said wafer and maintaining said wafer on said wafer carrier, and a positioning member located in said depressed region, and disposed substantially entirely between said inner wall portion of said depressed region and said flat area of said wafer for maintaining the position of said wafer within said depressed region.

55. The apparatus of claim 54 wherein said positioning member comprises a deformable member whereby said deformable member can maintain said position of said wafer within said depressed region during variations in temperatures within said reactor by deforming to accommodate differences in the linear expansion of said wafer carrier and said wafer.

56. The apparatus of claim 55 wherein said deformable member comprises a flexible wire.

57. The apparatus of claim 56 wherein said flexible wire includes a central head portion and a pair of extending wing portions for contacting said wafer.

58. The apparatus of claim 54 wherein said wafer carrier comprises a superalloy.

59. The apparatus of claim 58 wherein said superalloy comprises a superalloy of a metal selected from the group consisting of nickel and iron.

60. The apparatus of claim 54 wherein said wafer carrier comprises a ceramic material.

61. The apparatus of claim 54 wherein said positioning member comprises a superalloy.

62. The apparatus of claim 61 wherein said superalloy comprises a superalloy of a metal selected from the group consisting of nickel and iron.

63. The apparatus of claim wherein said positioning member comprises a ceramic material.

* * * * *

UNITED STATES PATENT AND TRADEMARK OFFICE
CERTIFICATE OF CORRECTION

PATENT NO. : 5,840,124
DATED : November 24, 1998
INVENTOR(S) : Gurary et al.

It is certified that error appears in the above-identified patent and that said Letters Patent is hereby corrected as shown below:

Column 7, line 13, "5" should read --6--.

Column 7, line 34, "1" should read --12--.

Column 9, line 8, after claim insert --36--.

Column 9, line 42, after claim insert --42--.

Column 9, line 42, "difference" should read --differences--.

Column 10, line 30, delete ",".

Column 10, line 33, delete ",".

Column 10, line 61, after claim insert "54".

Signed and Sealed this

Thirteenth Day of April, 1999

Attest:

Q. TODD DICKINSON

*Attesting Officer*   *Acting Commissioner of Patents and Trademarks*